United States Patent
Coakley et al.

(10) Patent No.: US 11,638,087 B2
(45) Date of Patent: Apr. 25, 2023

(54) CAVITIES AND ACTIVE REGIONS

(71) Applicant: CARBON AIR LIMITED, Manchester (GB)

(72) Inventors: John FitzGerald Coakley, Derbyshire (GB); Claudia Sofia Lehmann Fernandez, Salford (GB)

(73) Assignee: CARBON AIR LIMITED, Manchester (GB)

( * ) Notice: Subject to any disclaimer, the term of this patent is extended or adjusted under 35 U.S.C. 154(b) by 0 days.

(21) Appl. No.: 17/296,697

(22) PCT Filed: Nov. 27, 2019

(86) PCT No.: PCT/GB2019/053356
§ 371 (c)(1),
(2) Date: May 25, 2021

(87) PCT Pub. No.: WO2020/109793
PCT Pub. Date: Jun. 4, 2020

(65) Prior Publication Data
US 2022/0030350 A1    Jan. 27, 2022

(30) Foreign Application Priority Data

Nov. 27, 2018   (GB) ..................... 1819321

(51) Int. Cl.
*H04R 1/28*     (2006.01)
*B01J 20/26*    (2006.01)
(Continued)

(52) U.S. Cl.
CPC .............. *H04R 1/288* (2013.01); *B01J 20/26* (2013.01); *B01J 20/261* (2013.01); *B01J 20/265* (2013.01);
(Continued)

(58) Field of Classification Search
CPC ...... H04R 1/2876; H04R 1/288; H04R 1/025; H04R 1/04; H04R 2201/028;
(Continued)

(56) References Cited

U.S. PATENT DOCUMENTS 10,057,678 B2 *   8/2018   Kwon .................. H04R 1/2819
10,506,333 B2 *  12/2019   Wang .................. H04R 1/2876
(Continued)

FOREIGN PATENT DOCUMENTS

CN         106875934          6/2017

OTHER PUBLICATIONS

International Preliminary Report on Patentability in connection to Application No. PCT/GB2019/053356, dated Jun. 10, 2021.
(Continued)

*Primary Examiner* — Jason R Kurr
(74) *Attorney, Agent, or Firm* — Meunier Carlin & Curfman LLC

(57) ABSTRACT

The present invention relates to a method and apparatus for providing and/or receiving audible sound. In particular, the invention relates to apparatus, such as a micro speaker, which includes an active region which comprises an adsorbent element in the form of a self-supporting monolith-like element with a porous reticulated structure. The adsorbent element includes adsorbent material which comprises microporous organic polymer (MOP) material. The apparatus of the present invention is suitable for use in an electronic device, for example a mobile or portable electronic device, to provide improved audible sound.

20 Claims, 9 Drawing Sheets

(51) Int. Cl.
  *B01J 20/28* (2006.01)
  *B01J 20/32* (2006.01)
  *H03F 3/183* (2006.01)
  *H04R 1/02* (2006.01)
  *H04R 1/04* (2006.01)

(52) U.S. Cl.
  CPC ..... *B01J 20/28004* (2013.01); *B01J 20/2808* (2013.01); *B01J 20/28059* (2013.01); *B01J 20/28061* (2013.01); *B01J 20/28064* (2013.01); *B01J 20/28083* (2013.01); *B01J 20/28092* (2013.01); *B01J 20/3206* (2013.01); *B01J 20/3293* (2013.01); *H03F 3/183* (2013.01); *H04R 1/025* (2013.01); *H04R 1/04* (2013.01); *B01J 2220/44* (2013.01); *B01J 2220/445* (2013.01); *B01J 2220/82* (2013.01); *H03F 2200/03* (2013.01); *H04R 2201/028* (2013.01); *H04R 2499/11* (2013.01)

(58) Field of Classification Search
  CPC ...... H04R 2499/11; H03F 3/183; B01J 20/26; B01J 20/261; B01J 20/265; B01J 20/28004; B01J 20/28059; B01J 20/28061; B01J 20/28064; B01J 20/2808; B01J 20/28083; B01J 20/28092; B01J 20/3206; B01J 20/3293; B01J 2220/44; B01J 2220/445; B01J 2220/82
  See application file for complete search history.

(56) References Cited

U.S. PATENT DOCUMENTS

| | | | |
|---|---|---|---|
| 10,785,586 B2* | 9/2020 | Liu | C01B 32/384 |
| 11,109,149 B2* | 8/2021 | Feng | B01J 20/18 |
| 11,488,570 B2* | 11/2022 | Feng | H04R 1/025 |
| 2013/0170687 A1* | 7/2013 | Papakyriacou | B01J 20/2803 381/338 |
| 2017/0164096 A1 | 6/2017 | Herold et al. | |
| 2018/0142075 A1 | 5/2018 | Wood et al. | |
| 2020/0092636 A1* | 3/2020 | Sauer | H04R 1/2803 |

OTHER PUBLICATIONS

International Search Report and Written Opinion dated Feb. 7, 2020, from International Application No. PCT/GB2019/053356, 18 pages.
Shujun, X. et al. "Microporous Organic Polymers: Synthesis, Types, and Applications", Synthesis and Applications of Copolymers, First Edition, Jun. 23, 2014, pp. 125-164.
Examination report issued for Indian Application No. 202117027664, dated Dec. 29, 2022.
Gaab, Manuela, et al. "The progression of Al-based metal-organic frameworks-From academic research to industrial production and applications." Microporous and mesoporous materials 157 (2012): 131-136. al.doi.org/10.1016/j.micromeso.2011.08.016.

* cited by examiner

CAVITIES AND ACTIVE REGIONS

CROSS-REFERENCE TO RELATED APPLICATIONS

This application is a United States National Phase Patent Application of International Patent Application Number PCT/GB2019/053356, filed on Nov. 27, 2019, which claims the benefit of priority to GB Application No. 1819321.9, filed Nov. 27, 2018, the contents of which are incorporated by reference herein in their entirety.

The present invention relates to a method and apparatus for providing and/or receiving audible sound. In particular, but not exclusively, the present invention relates to apparatus, such as a micro speaker for providing audible sound, suitable for use in an electronic device, for example a mobile or portable electronic device.

Portable consumer electronics devices, such as earphones, headphones, earbuds, tablets and mobile phones or other such mobile electronic devices have continued to become more and more compact. As system enclosures/casings become smaller and the space available for speaker integration is reduced, so the space available for a speaker back volume decreases, and along with it, low frequency acoustic performance. Such speakers are examples of apparatus for providing audible sound.

In order to combat this performance limitation many forms of adsorbent materials have been developed that use adsorption/desorption effects to increase the acoustic compliance of these increasingly tiny cavities, thereby improving low frequency response. These materials have typically consisted of zeolites and various forms of Activated Carbon (AC) and/or carbon nanohorns. These materials have key drawbacks associated with their use.

For example, Zeolite based materials tend to be naturally strongly hydrophilic, meaning that their acoustic performance diminishes significantly when they are exposed to moisture in the air. A number of strategies have been developed to overcome this, dividing principally into barrier methods and hydrophobic treatments of the adsorbent materials themselves. These techniques can be complex, require several post-processes and may have questionable durability.

Carbon-based materials have a separate problem in that they are electrically conductive, and so may cause short circuits if the material interferes with electronic circuitry. These types of materials may also mask or interfere with the radio frequency emissions of any device in which they are positioned. This problem is exacerbated by the fact that many micro speaker housings have the associated device's antenna printed directly onto their backs.

There thus exists a need for a non-conductive and naturally hydrophobic adsorbent material with high acoustic performance that can be deployed in a way that fully maximises the small back-volume form factor made available to the acoustic engineer.

Metal Organic Framework (MOF) materials have been developed separately primarily for filtration and gas storage applications. These materials are natural electrical insulators and have micropore geometries that can be tuned to suit the need of the application, featuring surface areas that vastly exceed those of conventional adsorbent materials such as activated carbons.

Traditionally these materials have been fragile, expensive and unstable, though some are now emerging that are viable at industrial scales, such as Aluminium Fumarate based MOFs. However, for adsorption/desorption to take place at frequencies up to 1000 Hz, as is needed in micro speaker applications, the grain size of the material must be very small. This causes three problems.

Firstly, a small grain size accentuates the materials potential for absorbing moisture, as occurs with most Zeolite and other highly microporous materials. Secondly, small grain size causes the material to pack into a very dense layer which can result in the material's flow resistivity becoming too high. This causes the micropores to become inaccessible to the acoustic field. In other words, as the material packs down into a densified bed it stops working, acoustically. Thirdly, use of small grain material gives rise to the increased possibility of the powder being lost to the system and finding its way into neighbouring components or the outside air. Furthermore, according to certain prior art techniques binding the material into a solid block will cause at least some of the micropores to be masked, with a resultant loss of performance.

It is an aim of the present invention to at least partly mitigate one or more of the above-mentioned problems.

It is an aim of certain embodiments of the present invention to provide apparatus for providing and/or receiving audible sound, for example a micro speaker, suitable for use with a mobile electronic device (the term "mobile electronic device" as used herein includes a mobile phone, a smart phone, a laptop, a tablet or personal assistant, an electronic device for displaying images such as a television, a monitor, an audio visual projector or the like, a speaker such as a portable speaker, a smart speaker or a Bluetooth speaker, a vehicular speaker, a wearable electronic device such as a watch, hearing aid, a wearable computer, an earphone, a wearable smart device, a wearable navigation aid and a headphone), which apparatus includes one or more speakers and/or microphones that have superior acoustic performance relative to conventional techniques.

It is an aim of certain embodiments of the present invention to provide a micro speaker or a micro speaker housing, that is to say a small-scale speaker, that includes one or more active regions that comprise an adsorbent element which presents a little risk that the adsorbent material will leak from the speaker, which is very user-friendly and which can be easily and cleanly inserted into a micro speaker or electronic device as a simple part, both before the micro speaker has been installed into a mobile electronic device and also retrospectively into a pre-made or pre-existing mobile electronic device.

It is an aim of certain embodiments of the present invention to provide a method of manufacturing a material that can be used in the manufacture of a speaker or microphone, and which results in a finished speaker or microphone having good performance in use.

It is an aim of certain embodiments of the present invention to provide a material that can be incorporated in a way to enhance acoustic performance.

According to a first aspect of the present invention there is provided apparatus for providing and/or receiving audible sound, comprising:
  a housing that provides at least one cavity region;
  a vibratable element in or proximate to the cavity region; and
  an active region that comprises an adsorbent element in the form of a self-supporting monolith-like element with a porous reticulated structure, wherein the adsorbent element includes adsorbent material which comprises microporous organic polymer (MOP) material.

The term "self-supporting monolith-like element" is to be interpreted to mean a self-cohesive, and self-contained body.

Preferably the body is rigid or semi rigid. The term "reticulated structure" is used to describe that the structure of the monolith-like element is constructed in the form of a network, net, lattice or web. For the avoidance of doubt, the adsorbent element of the present invention does not include adsorbent material in loose/semi-loose particulate form, nor does it include adsorbent material coated on or entrained within a support element which does not provide a reticulated structure, and specifically does not include a support element with a woven, knitted or felted structure.

In one embodiment, the self-supporting monolith-like element comprises particles of adsorbent material bonded together using a binder material to form the self-supporting monolith-like element with a porous reticulated structure. A binder in liquid form may be used, but a binder in solid particulate form is preferred for mixing with the particulate adsorbent material. Suitable binder materials include one or more materials selected from polymers and/or pre-polymers for the preparation of thermoplastic-type and/or thermosetting-type materials and/or latex-type materials. An epoxy resin material is a particularly suitable binder.

Aptly the self-supporting monolith-like element is formed by curing, or otherwise treating, a starting mixture comprising the particulate adsorbent material and at least one binder, until it becomes a cohesive mass (the monolith-like element). Preferred binder materials are also porous following curing. Curing, or treating, may be achieved using an initiator compound, and/or treating with heat and/or using UV radiation.

Aptly the starting mixture contains at least 60% by weight of adsorbent material.

Aptly the starting mixture contains at least 80% by weight of adsorbent material.

Aptly the starting mixture contains around 8-18% by weight of powdered binder material and at least 90% by weight of a remainder of adsorbent material.

Aptly the adsorbent material is in solid particulate form when it is mixed with the binder and preferably at least 80% by weight, preferably at least 95% by weight, of the adsorbent material particles have a maximum diameter of 120 microns, preferably a maximum diameter of 100 microns, further preferably a maximum diameter of 85 microns. Particularly favourable results are obtained when the adsorbent material passes through a $\frac{1}{10}$ to $\frac{1}{12}$ mm mesh.

In the present embodiment, the at least one binder, once cured or otherwise treated, forms a reticulated structure or polymer matrix which surrounds or otherwise contains the adsorbent material to thereby provide the self-supporting monolith-like element of the present invention.

In a second embodiment the porous reticulated structure (which may also be termed herein as a porous polymer matrix) is provided by a foam material, that is, a substance made by trapping air or gas bubbles inside a solid or liquid.

Aptly the foam is an open cell, or at least a partially open cell, material.

Aptly adsorbent material is carried or contained by or within the cells of the foam material.

Aptly the foam material carries or contains at least 60% by weight, preferably 80% by weight, of adsorbent material.

Aptly ultrasonic and/or electrostatic methods are used to entrain the foam material with adsorbent material.

Aptly the adsorbent material is in solid particulate form when it is entrained within the foam material and preferably at least 80% by weight, preferably at least 95% by weight, of the adsorbent material particles have a maximum diameter of 120 microns, preferably a maximum diameter of 100 microns, further preferably a maximum diameter of 85 microns. Particularly favourable results are obtained when the adsorbent material passes through a $\frac{1}{10}$ to $\frac{1}{12}$ mm mesh.

Aptly the foam material is a pre-made and commercially available polymeric foam material, Aptly the foam is a polyurethane foam.

Alternatively, the foam material is produced by using an aqueous mixture of binder material, for example latex, PVA, etc, and particulate adsorbent material. Upon polymerisation, the particles of adsorbent material become trapped in the polymerised binder and removal of the water droplets produces a monolithic porous interconnected foam (a porous reticulated structure) comprising adsorbent material.

Further alternatively, the foam material is produced by polymerising an emulsion. Aptly the emulsion is a High Internal Phase Emulsion.

Aptly the foam is a polyHIPE material.

Aptly the self-supporting monolith-like element has a porous reticulated structure formed by the polyHIPE material.

Aptly polyHIPE material comprising particulate adsorbent material is prepared by impregnating MOP material into a pre-made polyHIPE foam material.

Alternatively, polyHIPE material comprising particulate adsorbent material is prepared by forming a partially cured polyHIPE foam material, followed by mixing it with particulate adsorbent material and then co-curing the resulting mixture. Aptly this results in particulate adsorbent material being embedded within the polyHIPE material.

Aptly the porous reticulated structure (also described herein as a polymer matrix or a porous interconnected foam structure) of the self-supporting monolith-like element of the present invention includes strut elements formed by cured polymeric material (this will be the binder material, the polymeric foam material, or the polyHIPE material, as determined by the preparative method used, as described above). These strut elements are generally disposed in a spaced apart relationship to thereby define voids or spaces (pores) within which particles of adsorbent material may be contained or carried. The strut elements act as spacers between adjacent regions of carried or contained particles of adsorbent material.

In a third embodiment, the self-supporting monolith-like element is prepared from suitable monomers and/or pre-polymers to produce a microporous organic polymer (MOP) adsorbent material, using a high internal phase emulsion process. The resulting product is a polyHIPE MOP material, i.e a MOP material which itself has a porous reticulated structure. This avoids the need for an additional reticulated structure forming material (described above as the binder, the polymer foam and the polyHIPE foam) to provide the porous interconnected foam structure or the porous reticulated structure of the self-supporting monolith-like element.

In accordance with the present invention:

Aptly the microporous organic polymer (MOP) material is an amorphous microporous organic polymer.

Aptly the microporous organic polymer (MOP) material is poly-dichloroxylene (P-DCX).

Aptly the adsorbent material further comprises a secondary adsorbent material. Aptly, the adsorbent material comprises less than 50% by weight, of a secondary adsorbent material. Aptly the adsorbent material comprises less than 15% by weight of a secondary adsorbent material.

Aptly the secondary adsorbent material comprises one or more materials selected from activated charcoal, zeolite and metal-organic framework (MOF) material.

Aptly the adsorbent material is porous and has pores in the region of 1 nm to 10 nm in diameter.

Aptly the pores each have an average diameter of about around 2 nm.

Aptly the adsorbent material is microporous.

Aptly the adsorbent material is mesoporous.

Aptly the adsorbent material will be of mixed porosity.

Aptly the adsorbent material is a gas-adsorbing material.

Aptly the adsorbent material comprises microporous organic polymer (MOP) material in the form of separate particles, for example as granules or powder, entrained or embedded within a support element with a reticulated structure to thereby form the self-supporting monolith-like element with a porous reticulated structure.

Aptly at least 80% by weight, preferably at least 95% by weight, of the adsorbent material particles have a maximum diameter of 120 microns, preferably a maximum diameter of 100 microns, further preferably a maximum diameter of 85 microns. Particularly favourable results are obtained when the adsorbent material passes through a 1/10 to 1/12 mm mesh.

Aptly the adsorbent material has a cage-like structure.

Aptly the adsorbent material is a man-made material.

Aptly the adsorbent material is an organic material.

Aptly the adsorbent material is synthesised to create a cage-like structure.

Aptly each cage is at least partially closed.

Aptly the adsorbent material is a material that does not have an ordered structure and optionally comprises an amorphous microstructure.

Aptly the adsorbent material is not electrically conductive.

Aptly the adsorbent material is an insulating material.

Aptly the adsorbent material is naturally hydrophobic.

Aptly the self-supporting monolith-like element is sealed between a first and a further sheet of a sealing material.

Aptly the self-supporting monolith-like element is sealed via a thermal process.

Aptly the sealing material is a flexible membrane.

Aptly the flexible material is a fine poro-elastic gauze material.

Aptly the flexible membrane comprises silk.

Aptly the flexible membrane is moisture impermeable.

Aptly the flexible membrane has a thickness of less than 0.5 mm thick.

Aptly the reticulated structure or polymer matrix provides a skeleton-like lattice.

Aptly the adsorbent element has pores in the region of 1 nm to 10 nm in diameter.

Aptly the pores of the adsorbent element each have an average diameter of about around 2 nm.

Aptly the adsorbent element is microporous.

Aptly the adsorbent element is mesoporous.

Aptly the adsorbent element will be of mixed porosity.

Aptly the adsorbent element is a gas-adsorbing material.

Aptly the adsorbent element has a surface area of at least 500 $m^2/g$.

Aptly the active region comprises a region of the housing of the apparatus of the present invention.

Aptly the active region comprises at least one wall member of the housing.

Aptly the active region comprises walls of the housing that are provided as the active region.

Aptly the active region comprises a panel or panels or body or bodies contained within the cavity region.

Aptly the walls of the housing which form the active region are provided by or constructed from adsorbent element material.

Aptly the active region comprises a flexible bag including one or more adsorbent elements in the cavity region or the active region comprises at least one wall member of the housing and a panel or panels in the cavity region or the active region comprises at least one wall member of the housing and at least one flexible bag including one or more adsorbent elements in the cavity region.

Aptly there is provided a speaker or microphone that comprises the apparatus according to the first aspect of the present invention.

Aptly the active region is in fluid communication with at least a rear surface of the vibratable element and/or optionally is in fluid communication with the cavity region.

According to a second aspect of the present invention there is provided a mobile electronic device, comprising:
a case body; and
at least one speaker unit or microphone unit in the case body; wherein
each speaker unit or microphone unit comprises a housing that defines at least one cavity region, a vibratable element in or proximate to the cavity region and an active region that comprises one or more adsorbent elements in the form of a self-supporting monolith-like element with a porous reticulated structure, wherein the adsorbent element includes adsorbent material which comprises microporous organic polymer (MOP) material.

Aptly the at least one speaker unit comprises a main external speaker unit of the mobile device and/or an ear speaker unit of the mobile device.

Aptly the mobile electronic device comprises a mobile phone.

Aptly the mobile phone comprises a smart phone.

Aptly the mobile electronic device comprises an earphone or tablet or laptop or digital assistant or watch or smart wearable or navigation aid or headphone or TV or monitor or portable speaker or smart speaker or Bluetooth speaker or vehicular speaker.

Aptly the mobile electronic device is wearable.

Aptly the mobile electronic device further comprises a speaker driver in each speaker unit; and
a controller for providing drive signals to the speaker driver.

Aptly each speaker driver comprises a voice coil or at least one MEMS device and at least one diaphragm element.

Aptly the mobile electronic device comprises a display.

Aptly the display is a touchscreen.

According to a third aspect of the present invention there is provided one or more volume-enhancing elements which include adsorbent material comprising microporous organic polymer (MOP) material and which are in the form of a self-supporting monolith-like element with a porous reticulated structure, for use in a micro speaker or loudspeaker configuration, wherein the adsorbent material comprises an organic polymer (MOP), featuring component materials with innate hydrophobicity, such as poly-dichloroxylene (P-DCX).

According to a fourth aspect of the present invention there is provided a method for providing an adsorbent-impregnated PolyHIPE material without masking the pores of an adsorbent-impregnated in the PolyHIPE material, comprising the steps of partially cross-linking the PolyHIPE with heat or UV light, before incorporating particulate adsorbent material and then completing the cross-linking with heat or UV light, wherein the adsorbent material comprises an amorphous microporous organic polymer (MOP), ideally Poly-dichloroxylene (P-DCX).

According to a fifth aspect of the present invention there is provided an effective volume increasing structural component material, for use in any micro speaker or loudspeaker configuration, comprising an adsorbent material-impregnated polyHIPE material, which forms its own low-permeability outer skin during UV or thermal curing wherein optionally the skin may be augmented by the addition of a non-load-bearing shell or impermeable film. The adsorbent material comprises an organic polymer (MOP) material, featuring component materials with innate hydrophobicity, such as a poly-dichloroxylene (P-DCX)

According to a sixth aspect of the present invention there is provided a speaker system, comprising:
a speaker unit; and
a cabinet forming a chamber at a back region or side region of the speaker unit largely filled with one or more volume-enhancing elements in the form of a self-supporting monolith-like element with a porous reticulated structure. The volume-enhancing element(s) include adsorbent material which comprises organic polymer (MOP) material, ideally poly-dichloroxylene (P-DCX). Optionally, the self-supporting monolith-like element is covered or sealed using a fine poro-elastic gauze material or silk, or a high-density impermeable shell.

According to a seventh aspect of the present invention there is provided a speaker system, comprising:
a speaker unit; and
a cabinet forming a chamber at a back region or side region of the speaker unit largely filled with one or more volume-enhancing elements comprising an adsorbent-impregnated polyHIPE material in the form of a self-supporting monolith-like element with a porous reticulated structure; wherein
adsorbant-impregnanted polyHIPE material comprises an organic polymer (MOP) material, featuring component materials with innate hydrophobicity, such as poly-dichloroxylene (P-DCX).

According to an eighth aspect of the present invention there is provided a speaker system, comprising:
a speaker unit;
a cabinet at a back region or side region of the speaker unit which does not form a back-volume chamber, but which instead comprises entirely of an adsorbent element in the form of a self-supporting monolith-like element with a porous reticulated structure which includes adsorbent material comprising microporous organic polymer (MOP) material (as described above);
the internal faces of the monolith-like element include grooves or channels in intimate contact with the back face of the speaker, to act as low-resistivity access channels to help the sound permeate throughout the material; and
the self-supporting monolith-like element is gas-adsorbing. An ideal adsorbent material comprises amorphous microporous organic polymers (MOP), featuring component materials with innate hydrophobicity, such as Poly-dichloroxylene (P-DCX).

According to a ninth aspect of the present invention there is provided a speaker system, comprising:
a speaker unit;
a cabinet forming a chamber at a back region or side region of the speaker comprising of an MOP adsorbent-impregnated polyHIPE material, which forms its own low-permeability outer skin during UV or thermal curing; or a polyHIPE MOP material as described above;
a volume-enhancing felt insert that sits within the cabinet, comprising of a gas permeable upper layer, ultra-fine particles of a gas adsorbing material dispersed at high concentrations within a fibrous matrix without using binder, and an impermeable back layer; and
the gas-adsorbing material may be a Metal Organic Framework material treated with a hydrophobic coating, or an amorphous microporous organic polymer (MOP), featuring component materials with innate hydrophobicity, such as Poly-dichloroxylene (P-DCX).

According to a tenth aspect of the present invention there is provided a microphone system, comprising:
at least one transducer element for converting sound to an electrical signal;
optionally a preamplifier that receives an output from the transducer element;
a housing or cabinet at a back region or side region of the transducer element; and
an active region that comprises at least one adsorbent material in the form of a self-supporting monolith-like element with a porous reticulated structure (as described above).

Aptly the transducer element converts air pressure variations associated with sound waves to an electrical signal.
Aptly the microphone system is a dynamic microphone or a condenser microphone or a piezoelectric microphone.
Aptly there is provided a mobile electronic device that comprises the microphone system according to the eleventh aspect of the present invention.
Aptly the mobile electronic device is a mobile phone or hearing aid.

Certain embodiments of the present invention provide apparatus for providing and/or receiving audible sound in which an active region (which comprises one or more adsorbent elements in the form of a self-supporting monolith-like element with a porous reticulated structure, wherein the adsorbent element includes adsorbent material which comprises microporous organic polymer (MOP) material) enhances acoustic performance relative to conventional techniques.

Certain embodiments of the present invention provide a method of manufacturing a microphone and/or a speaker such as a micro speaker or loudspeaker.

Certain embodiments of the present invention provide a MOP based material that achieves performance benefits for a loudspeaker or microphone relative to conventional techniques in a cost effective, highly stable and hydrophobic form. This can be achieved using one or more adsorbent elements in the form of a self-supporting monolith-like elements with a porous reticulated structure, formed as described above.

Certain embodiments of the present invention provide MOP based materials which are synthesised from component parts which are innately hydrophobic, which results in a material with a high degree of natural hydrophobicity.

Certain embodiments of the present invention provide a speaker and/or microphone and/or cabinet for a speaker and/or microphone in which materials are presented to a sound field in the form of a self-supporting monolith-like element with a porous reticulated structure comprising MOP material, as described above. Alternatively, the speaker and/or microphone cabinet itself can be created from and/or can house a porous open pored foam produced by polymerising an emulsion known as a high internal phase emulsion (HIPE).

Certain embodiments of the present invention will now be described hereinafter, by way of example only, with reference to the accompanying drawings in which.

In the drawings like reference numerals refer to like parts.

Certain embodiments of the present invention relate to a mobile electronic device and to apparatus in a mobile electronic device for generating audible sound. As mentioned above, a mobile electronic device can be a mobile phone such as a smartphone or laptop or earphone or earbud or headphones or navigation device or TV or monitor or smart speaker or Bluetooth speaker or vehicular speaker, or can be a wearable electronic device such as a smartwatch or smart clothing. The apparatus for providing audible sound can be a speaker or the like. The speaker can be small in which situation the speaker may be referred to as a mini speaker or micro speaker. An example of a micro speaker is an ear speaker or main external speaker of a smartphone.

A typical smartphone (for example a Samsung Galaxy S8 smartphone) includes a rear casing that has a grill for an ear speaker. In operation, the ear speaker generates sound pressure waves which provide sound audible to a human ear when it exits from an internal region within the housing where an ear speaker is located via multiple through apertures in the grill to the listener. In addition to the ear speaker, a smart phone may also include one or more further speaker units and generally one of these further speaker units is designated a main external speaker designed to provide audible sound through an exit aperture in a side panel of the smartphone. The side panel can be part of the overall smart phone casing, which forms a housing for the smartphone and supports a touchscreen.

Figure 1:
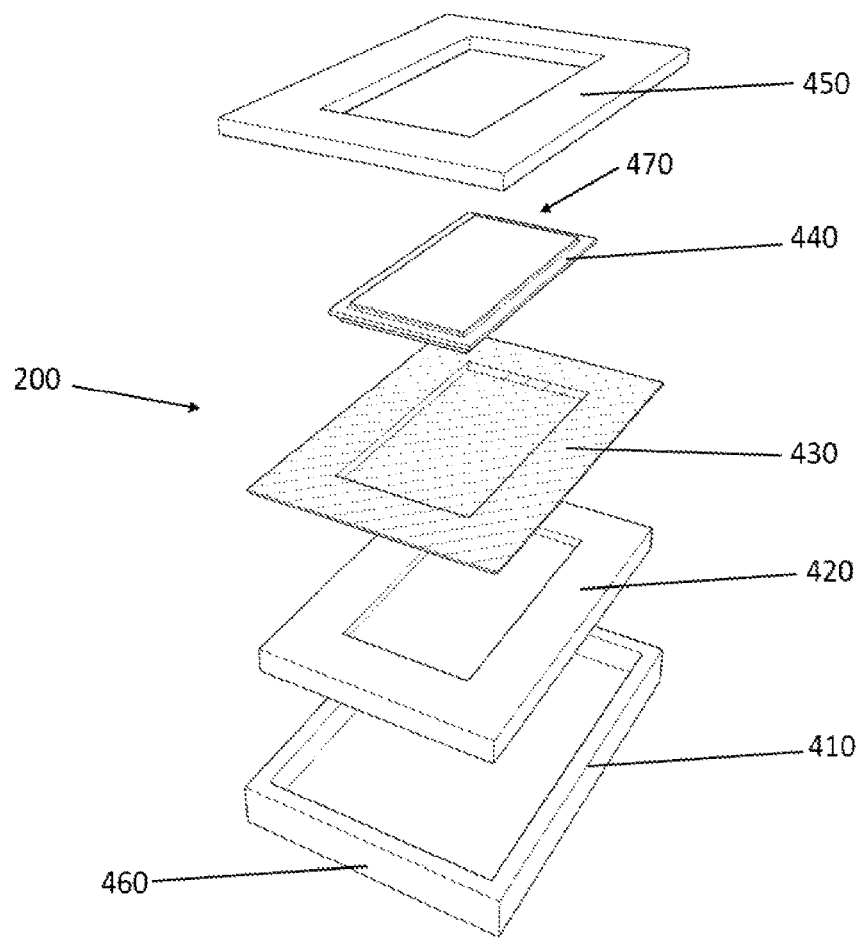
FIG. 1 illustrates an exploded view of an ear speaker.

FIG. 1 illustrates an exploded view of the ear speaker. A speaker 200 includes a cabinet housing 410 which encompasses a "back-volume" which can be occupied (partially or fully) by a volume-enhancing active region. In the embodiment illustrated in FIG. 1 the cabinet housing encompasses a back volume which is occupied by a volume enhancing material comprising an adsorbent element 420 in the form of a self-supporting monolith-like element with a porous reticulated structure, wherein the adsorbent element includes adsorbent material which comprises microporous organic polymer (MOP) material. As shown, the adsorbent element 420 is covered by a thin membrane 430 which helps to protect the active region from moisture ingress. The thin membrane is located between the active region and an upward (in FIG. 1) facing loudspeaker driver 440 comprising a vibratable element 470 which is the element which provides soundwaves audible as sound. Aptly the thickness of the flexible membrane is less than 0.5 mm. Optionally, the volume enhancing material may be provided as a polymerised high internal phase emulsion (i.e. a polyHIPE) with an impregnated microporous organic polymer (MOP) material. Optionally, the housing 410 may be wholly or partially provided as an active region. For example, one or more outer walls 460 of the housing may be provided as a volume-enhancing active region. The housing for the speaker has a front plate 450 which helps complete the composite enclosure. In an alternative embodiment, the ear speaker 200 illustrated in FIG. 1 may instead be a microphone unit for receiving sound. In this embodiment, the loudspeaker driver 440 may be replaced with a sound receiving unit such as a transducer element comprising a vibratable element which is the element which receives soundwaves and converts the air pressure variations associated with the soundwaves into an electrical signal. Optionally a preamplifier receives an output from the transducer element. It will be appreciated that according to certain aspects of the present invention, the microphone unit may be provided in proximity to or in a different location to a speaker unit. For example, the smartphone casing may comprise a further aperture which may enable audible sound to pass into the smartphone for reception by a microphone unit. It will also be appreciated that according to certain embodiments of the present invention one, two, three or more microphone units may be provided in a mobile device. In a further embodiment, at least one speaker unit and at least one microphone unit may be provided as a composite unit.

Figure 2:
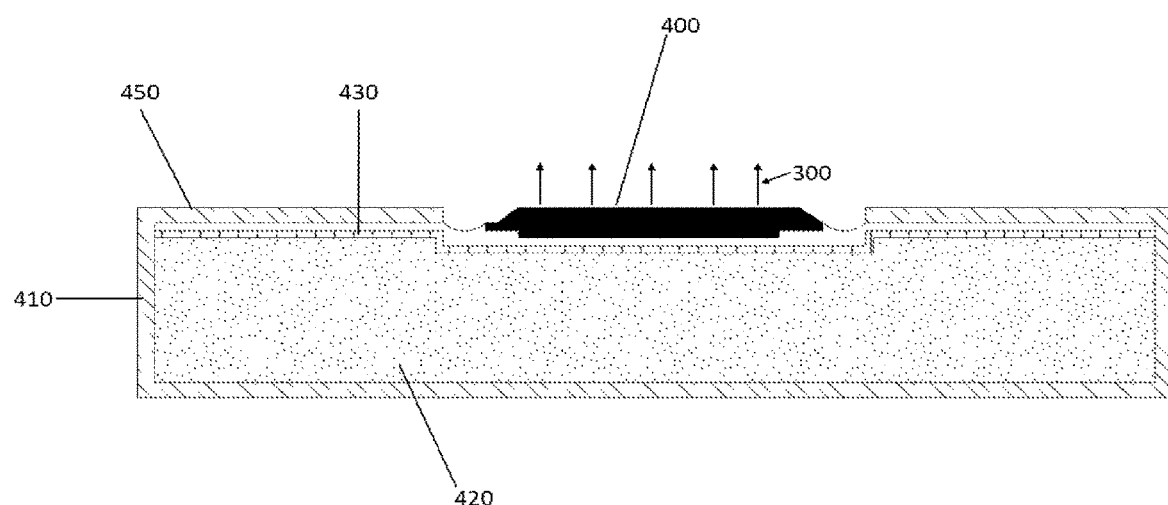
FIG. 2 illustrates a cross section through the ear speaker.

FIG. 2 illustrates a cross section through the ear speaker shown in FIG. 1 in more detail.

Figure 3:
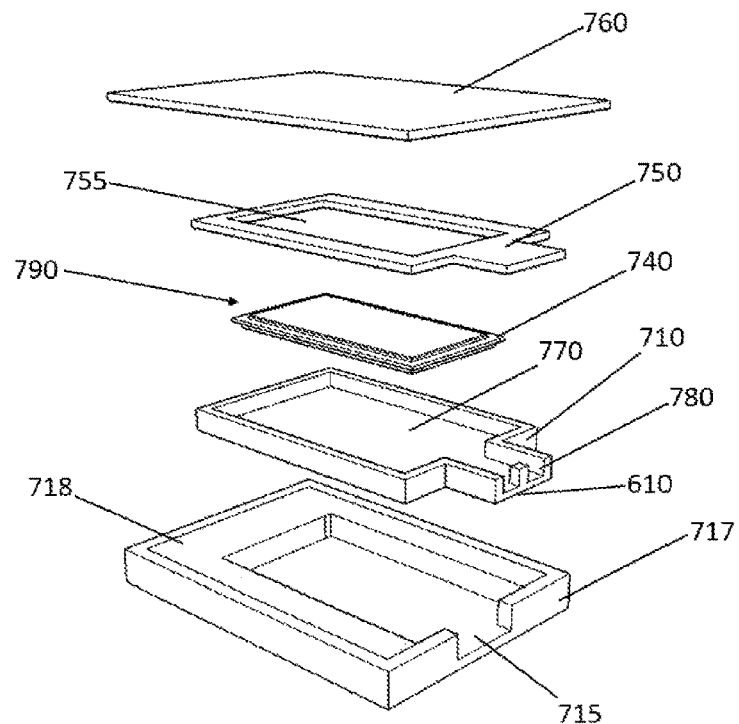
FIG. 3 illustrates an exploded view of an alternative speaker.

FIG. 3 illustrates an alternative speaker 600 which can, for example, be utilised as an external speaker. This includes a horn-like acoustic neck 610 that includes a channel for sound to feed out through the exit aperture in a casing of a smartphone. As shown in FIG. 3 the speaker 600 includes a speaker housing 710 which sits in an outer cavity 715 provided by an outer housing 717 in which an active region of volume enhancing material 718 is provided. In the embodiment shown in FIG. 3 the active region is a generally C-shaped region. A loudspeaker driver 740 which comprises a vibratable element 790 sits within the smaller internal speaker housing 710 and that smaller speaker housing 710 is partially closed by a cover 750. An outer cavity defined by the main outer housing 717 is closed by a cover plate 760. The speaker thus includes an inward facing loudspeaker 710, 740, 750 that sits within a larger volume defined by an outer housing 717, 760 augmented by a volume enhancing material 718. The driver 740 faces downwards (in FIG. 7) acting to generate pressure fluctuations within the cavity 770 within the inner housing 710. This horn like cavity 770 feeds sound to the outside of the device via an acoustic channel 780. The outer cavity defined by the lower housing 717 and the plate or cover 760 is acted upon by the rear of the driver. The volume enhancing material of the active region within this cavity acts to increase the acoustic compliance of the air inside the cavity thereby improving low frequency response.

Figure 4:
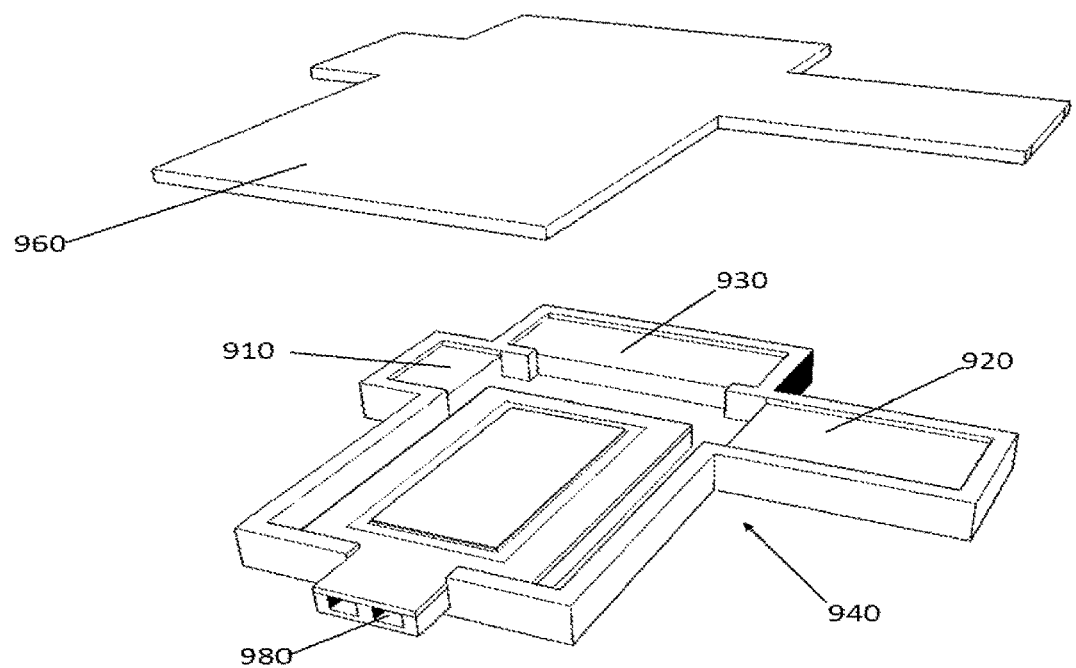
FIG. 4 illustrates an alternative speaker with side chambers filled with active region but with a remaining central region empty.

FIG. 4 illustrates a speaker similar to that shown in FIG. 3, but with a cover plate 960 removed to reveal an active region with a basic rectangular design augmented with one or more (three shown) side chambers 910, 920, 930. In the embodiment illustrated in FIG. 4, the side chambers each contain a volume enhancing element (an active region), whereas the back volume (the cabinet housing 840) is empty of a volume enhancing element.

In a similar but alternative embodiment of FIG. 4 (alternative embodiment not shown), each of the side chambers and the main chamber contain a volume-enhancing element (the active region).

Figure 5:
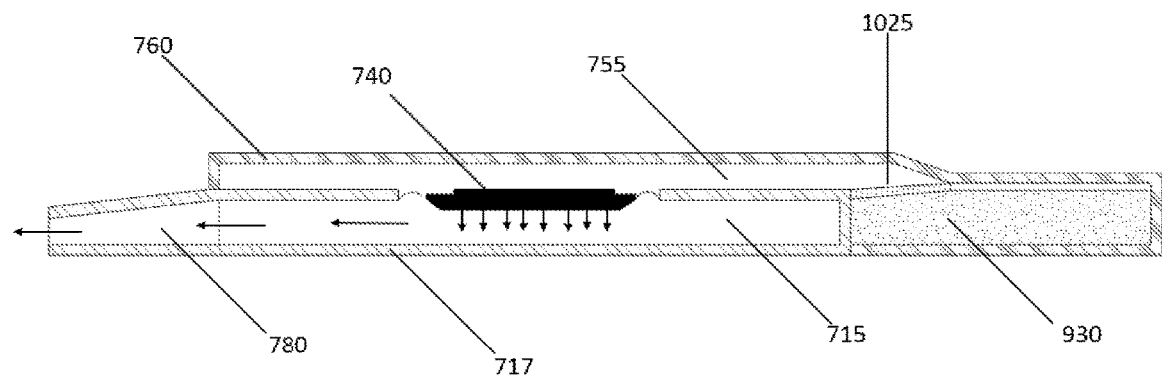
FIG. 5 illustrates a cross section through a speaker.

FIG. 5 illustrates a detailed cross section of a speaker featuring a horn like internal acoustic cavity shown in FIG. 4. FIG. 5 helps illustrate how a side chamber 930 can include a volume enhancing material comprising an adsorbent element in the form of a self-supporting monolith-like element with a porous reticulated structure, and which includes adsorbent material that comprises microporous organic (MOP) polymer. As shown, the active region is covered by an optional membrane 1025. Aptly, the monolith-like element may be covered by a membrane. FIG. 5 also helps to illustrate how the active region formed by the side chamber 930 may be in fluid communication with an outer region of the loudspeaker driver 740 to thereby increase acoustic compliance of the air inside the cavity and thereby improve low frequency response.

Figure 6:
FIG. 6 illustrates a cross section through an alternative speaker.

FIG. 6 illustrates a similar cross section through a speaker to that shown in FIG. 5, except that in this embodiment a back volume is augmented by volume enhancing material in monolith form which forms an entirety of a side chamber. The volume enhancing material is be provided as a polymerised high internal phase emulsion (i.e. a polyHIPE) with an impregnated Microporous Organic Polymer (MOP) material. The cabinet forming the horn cavity is formed from a conventional plastic wall. An acoustic enclosure around the back volume is formed from a high-density impermeable shell component 1110. The impermeable shell is bonded to the plastic walls of the horn component using glue (or binder or other such element) with a suitable overlapping tab to ensure that the back-volume enclosure is acoustically sealed.

The volume-enhancing material comprising an adsorbent element in the form of a monolith-like element with a porous reticulated structure and providing the active region, may be created via any of the methods described herein. For example, particles of a MOP material may be bound into monolithic form with a binder such as latex. Alternatively, particles of MOP material may be impregnated within a support element comprising a PolyHIPE. In a further alternative, the monolith may be directly synthesised from a MOP material such as P-DCX without the need for a binder to be used.

Figure 7:
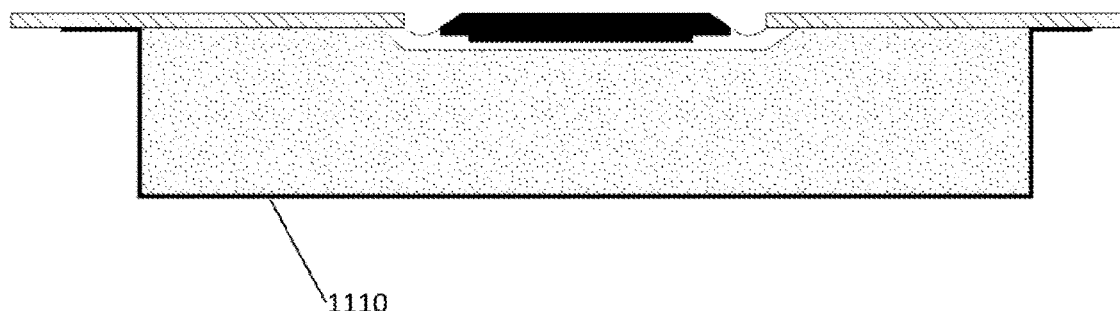
FIG. 7 illustrates a cross section through a further alternative speaker.

FIG. 7 helps illustrate a cross section through a further alternative ear speaker with a monolithic form of volume enhancing material surrounded by a high-density impermeable shell instead of a cabinet housing. In this embodiment the micro speaker driver is mounted within a conventional plastic plate. The impermeable shell is bonded to the underside of the plate using glue (or alternatively binder or the like) with a suitable overlapping tab to ensure that the enclosure is acoustically sealed.

Certain embodiments of the present invention relate to a smartphone micro speaker.

It has been determined that there is an acoustic benefit of providing an active region on the low frequency response (sub 900 Hz) behaviour of a mobile phone without causing electromagnetic masking of the behaviour of the phone antenna. Around a 3 dB improvement may be achieved. In one embodiment, the active region can be incorporated into the back volume of a micro speaker enclosure, and in another embodiment the micro speaker enclosure itself may be replaced by casting the enclosure from the adsorbent element material itself, encapsulated by an impervious plastic skin. Alternatively, a combination of a panel or panels (bodies) of the adsorbent element within part of the speaker enclosure itself can be used.

According to certain embodiments of the present invention an average gain of approximately 2.97 dB has been recorded when inserting a MOP impregnated PolyHIPE sample (when averaging in the range of 100-900 Hz).

Electric impedance and near-field frequency response of a micro speaker can be measured within a Bruel and Kjaer soundproof BOX, mounted within a structure that allows position fixing and a microphone distance of 10 mm from the speaker outcome. Audiomatica SRL—CLIO equipment and software, release 1.4, pocket version was used to perform the measurements.

The equipment consists of a CP-01 audio interface box and a condenser electret microphone (with accuracy of 1 dB from 20 Hz to 10 kHz). The audio interface with analog RCA connections and sampling frequencies of 96 and 48 kHz, containing:

A signal generator of 1 Hz-45 kHz, with a frequency accuracy of 0.01% and resolution of 0.01 Hz.

An AC analyser of 24 bit sigma delta A/D converter and an input range of +40 dBV down to −40 dBV A DC analyser of 12 bit A/D Converter with an input range of +6.5V to −6.5V The performance enhancement of a micro speaker was measured after filling approximately 85-90% of its cavity with an adsorbent element in the form of MOP impregnated PolyHIPE samples. Other fill factors can of course be utilised. Empty and partially filled micro speakers were measured by these means, obtaining the electric impedance and frequency response. The improvement in performance was calculated afterwards as the difference between the frequency response of the partially filled and the empty micro speaker. In order to take account for the errors associated with the position of the microphone and speaker, several measurements were taken, and a correlation was established through standard deviation. As a non-limiting example, the MOP material may be polymerised dichloroxylene (P-DCX).

Test Results

A number of micro speakers have been tested with an active region.

After the selection of an adequate glue and filling procedure (appropriate sealing mesh), 11 micro speakers were successfully enhanced but at different rates.

TABLE 1

Example filling characteristics for micro speakers

| Speaker Name | Trace notation as used in FIGS. 8-11 | Type of (partial, 85-90%) filling | $f_0$ [Hz] | Mean ΔfR [dB] 100 Hz < f < 900 Hz |
|---|---|---|---|---|
| Empty micro speaker | ———— | Empty closed speaker | 897.6 ≈ $V_0$ | — |
| Spk3 | — · — · — | MOP-impregnated in Basotect G+ foam | 848.31 ≈ 1.13 $V_0$ | 2.255 |

TABLE 1-continued

Example filling characteristics for micro speakers

| Speaker Name | Trace notation as used in FIGS. 8-11 | Type of (partial, 85-90%) filling | $f_0$ [Hz] | Mean ΔfR [dB] 100 Hz < f < 900 Hz |
|---|---|---|---|---|
| Spk10 | – – – – | MOP impregnated polyHIPE. | 780.9 ≈ 1.15 $V_0$ | 2.9698 |
| SpkS | ············ | Hyper crosslinked polyhipe, MOP block, unsifted | 777.92 ≈ 1.34 $V_0$ | 3.039 |

Table 1 presents the filling characteristics of a micro speaker containing an active region comprising an adsorbent element in the form of a self-supporting monolith-like element with a porous reticulated structure according to the present invention, and shows the frequency response enhancement results obtained for this adsorbent element and also the frequency response enhancement results for a control empty micro speaker.

FIGS. 8 to 11 show low frequency response, wider range frequency response, differential frequency response and electric impedance (resonant frequency) of an empty micro speaker (shown as '-' in FIGS. 8-11), a micro speaker with a MOP-polyHIPE adsorbent element (speaker 3 shown as '_∎_∎_∎' in FIGS. 8-11), a micro speaker with a MOP impregnated PolyHIPE inclusion (speaker 10, shown as '_ _ _ _' in FIGS. 8-11) and a micro speaker with a hyper crosslinked polyhipe, MOP blockcopolymer (unsifted) (speaker S-monolith, shown as '━━━' in FIGS. 8-11).

Compared with the control empty micro speaker, speaker 10 (MOP impregnated polyHIPE), achieved a main gain of about 3 dB and resonant frequency shifting, further the volume increased by some 30%.

Figure 8:
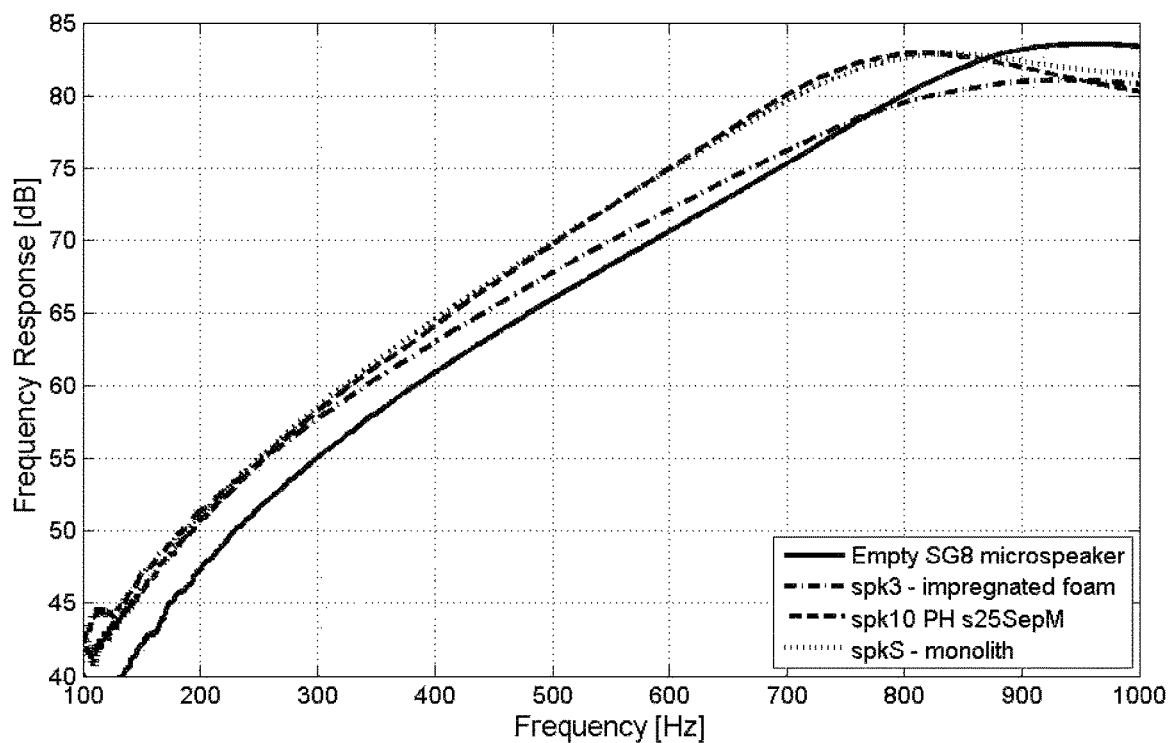
FIG. 8 illustrates low frequency response of empty and selected partially filled micro speakers.

FIG. 8 shows that whilst MOP impregnated polyHIPE filled micro speakers produce some sound enhancement over an empty micro speaker at very low frequencies, this MOP impregnated polyHIPE material achieves particularly significant improvements in performance at frequencies above 600 Hz.

Figure 9:
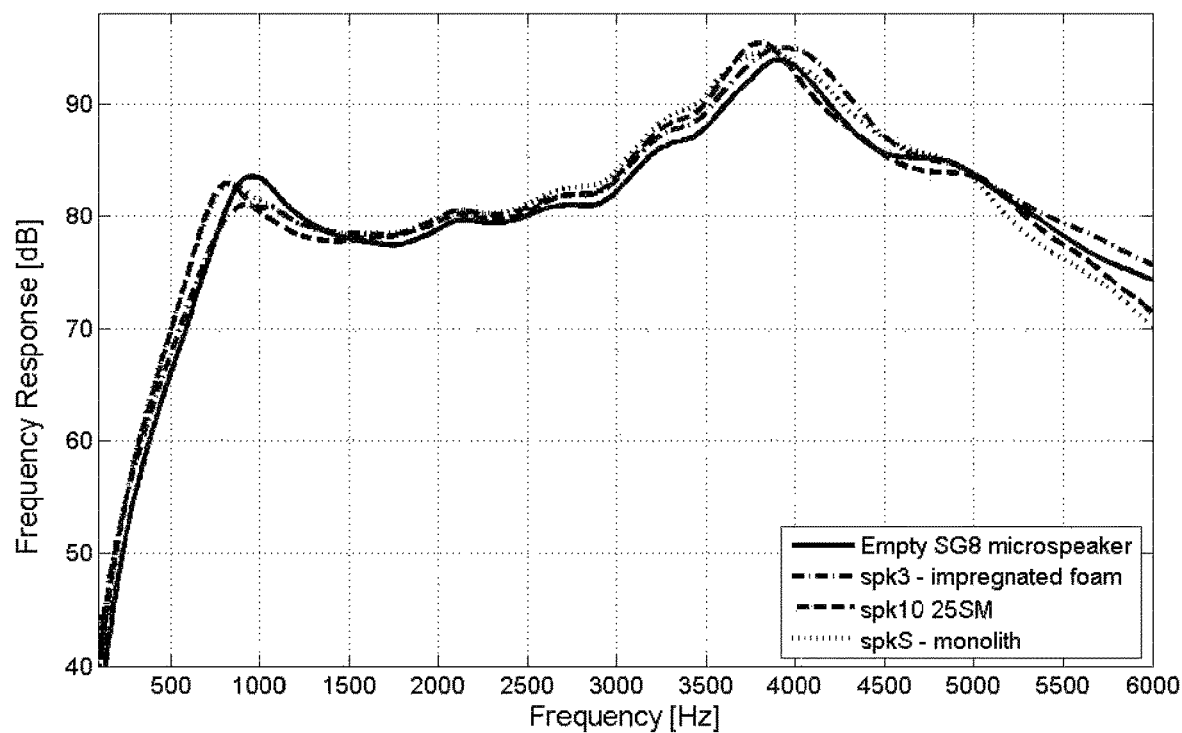
FIG. 9 illustrates higher range frequency response of empty and selected partially filled micro speakers.

FIG. 9 shows the frequency response for the tested micro speakers over a broader frequency range, reaching to 6000 Hz. It can be seen that MOP impregnated polyHIPE filled speakers preserve the peak performance at around 3750 Hz.

Figure 10:
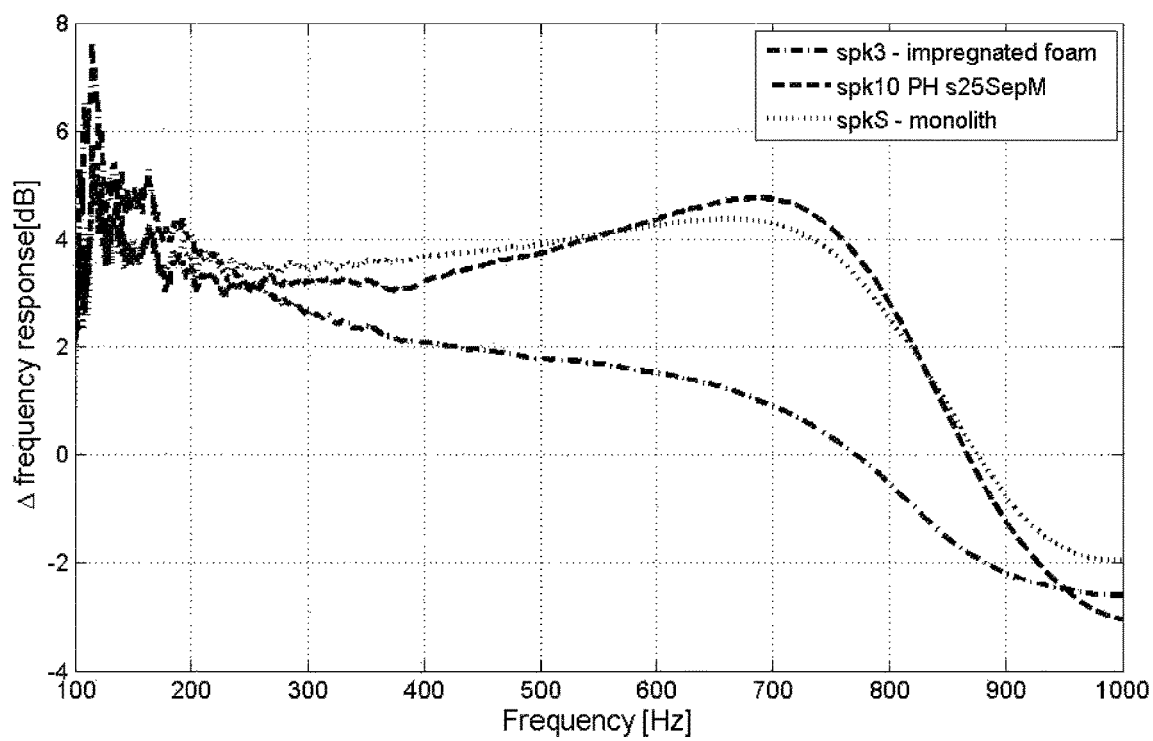
FIG. 10 illustrates differential frequency response (SR filled-SR empty) of selected partially filled micro speakers.
Figure 11:
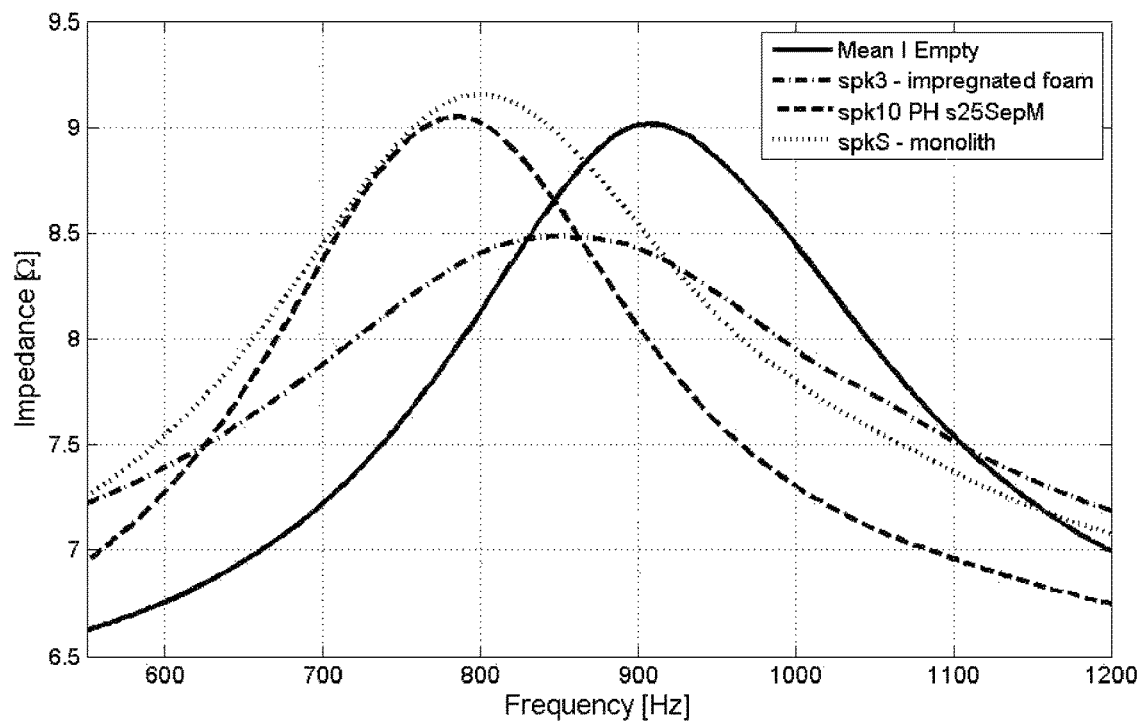
FIG. 11 illustrates electric impedance of micro speakers with an empty case and selected fillings.

FIG. 10 shows the relative frequency response of the filled speakers to the empty case across the lower frequency range. A significant improvement in the high end of the low frequency region, above 600 Hz is observed for the MOP impregnated polyHIPE micro speaker FIG. 11 shows the electric impedance of the MOP impregnated polyHIPE filled micro speaker compared to the empty micro speaker. A large compliance enhancement is seen by the inclusion of MOP impregnated polyHIPE with 110 Hz of left resonance shifting, which indicates an apparent cavity increase of around 30%. MOP impregnated polyHIPE also achieves less damping and lower losses in frequencies close to resonance and in the mid-range.

One of the key benefits of using an adsorbent element in the form of a self-supporting monolith-like element is that it presents a little risk that the adsorbent material will leak from the speaker. Another advantage is that the self-supporting monolith-like element is very user-friendly and can be easily and cleanly inserted into a micro speaker or electronic device as a simple part, both whilst a mobile electronic device is being initially constructed and also retrospectively into a pre-made or pre-existing mobile electronic device to improve the acoustic performance thereof. A still further advantage is that a self-supporting monolith-like element comprising microporous organic polymer (MOP) material is naturally hydrophobic and non-conducting, thereby mitigating problems with earlier adsorbent elements which need to be treated or protected to avoid moisture damage and to guard against causing audio interference or noise.

An improvement according to certain embodiments of the present invention includes the creation of a shell-covered enclosure or partial enclosure of the back-volume portions made of MOP impregnated polyHIPE, optionally with a loose MOP inclusion to further enhance performance.

Figure 12:
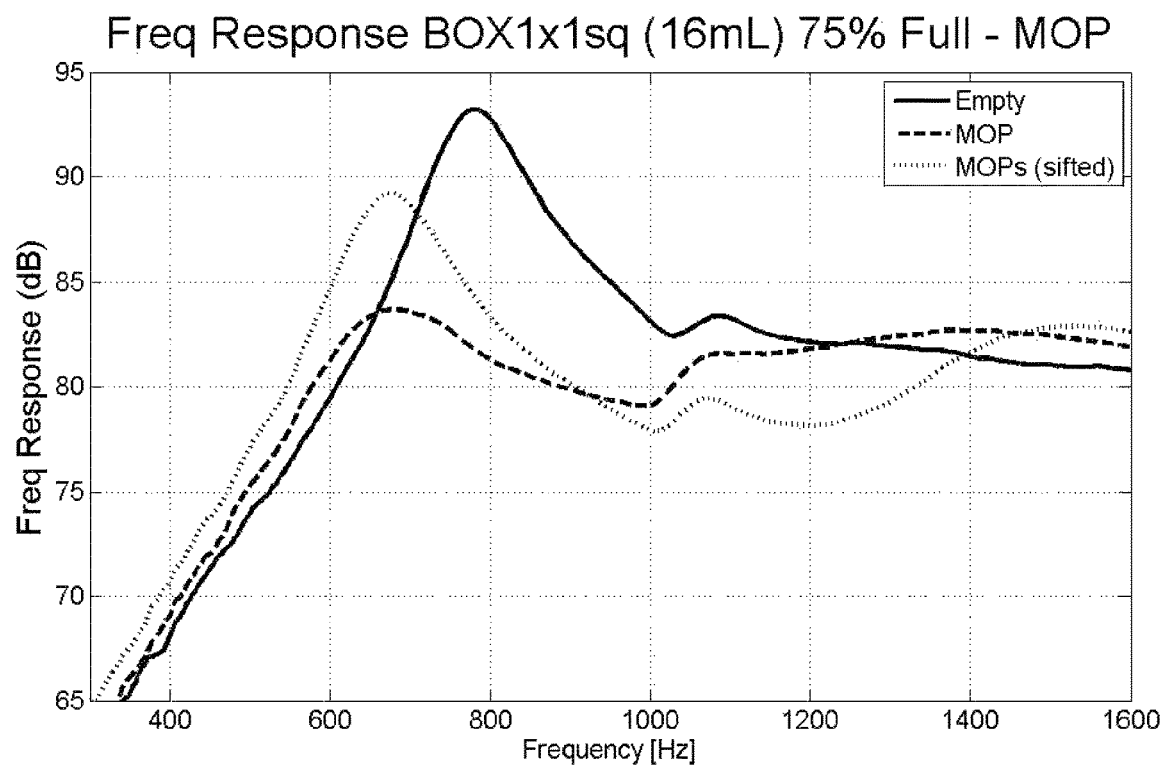
FIG. 12 illustrates particle size effects.
Figure 13:
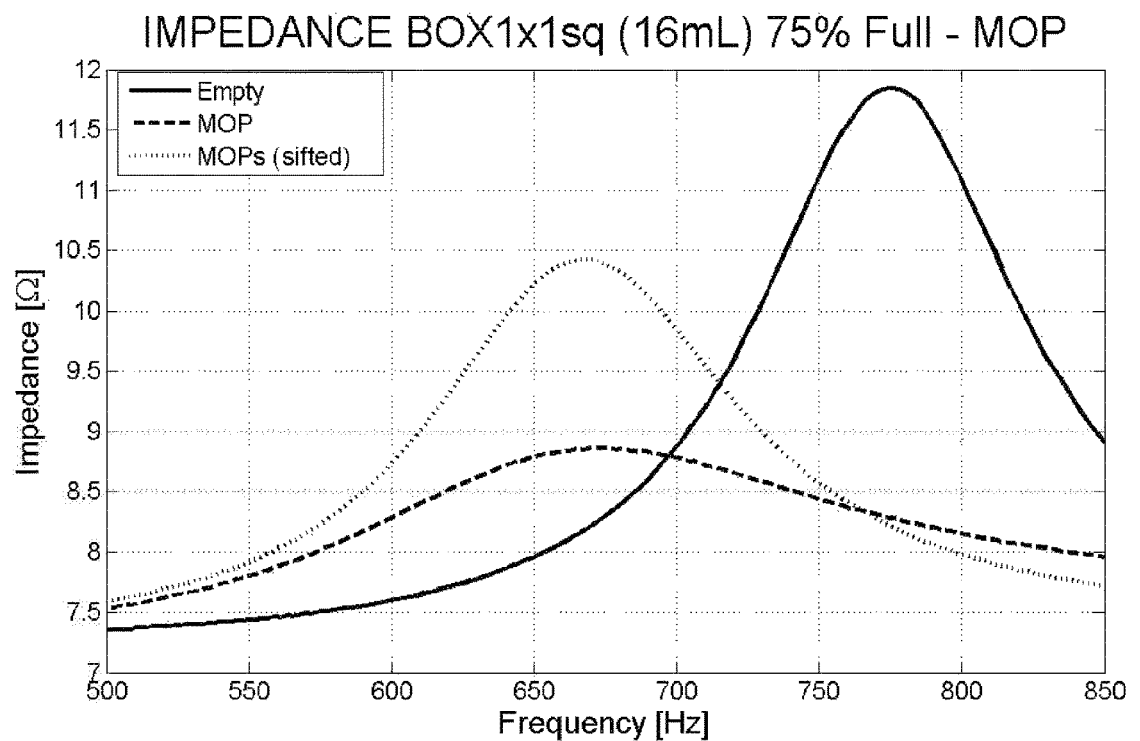
FIG. 13 illustrates particle size effects.
Figure 14:
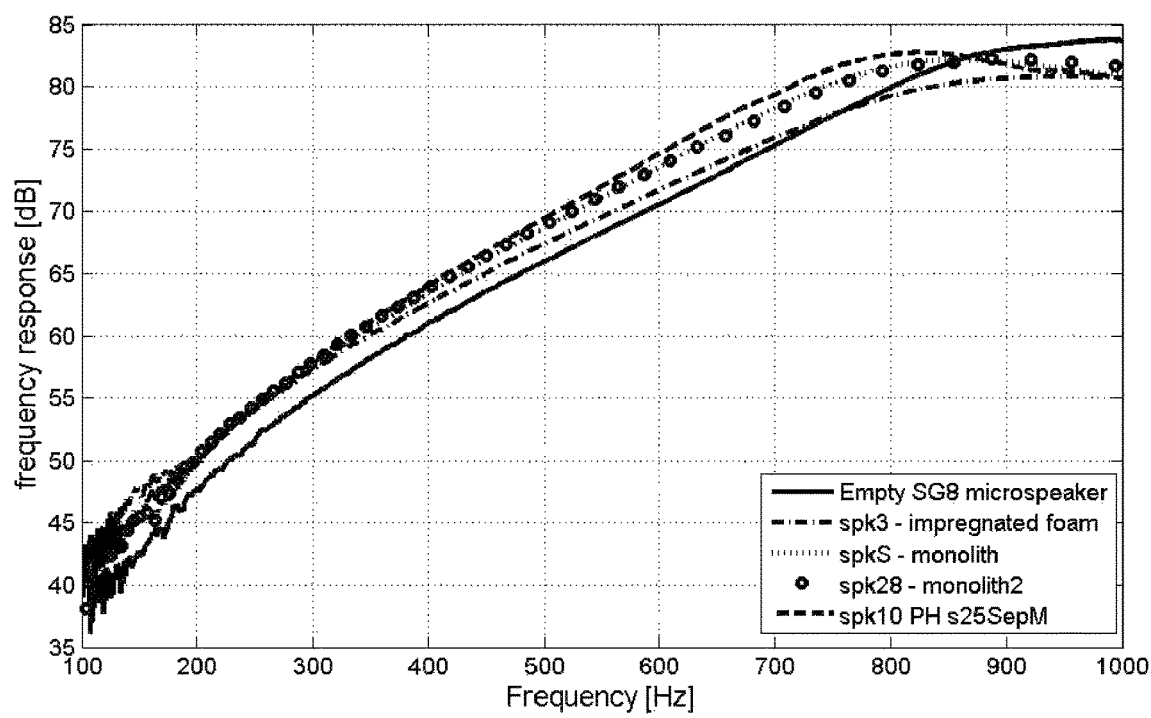
FIG. 14 illustrates frequency response for monolithic-like adsorbent elements of the present invention in a micro speaker.
Figure 15:
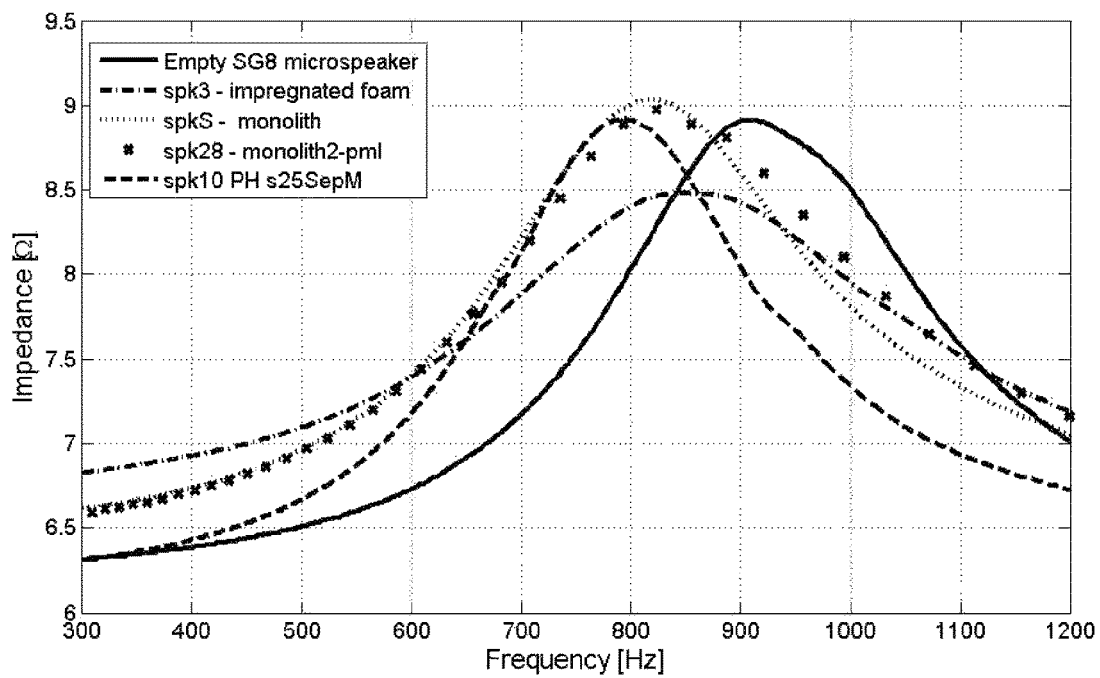
FIG. 15 illustrates electric impedance response for monolithic-like adsorbent elements of the present invention in a micro speaker.
Figure 16:
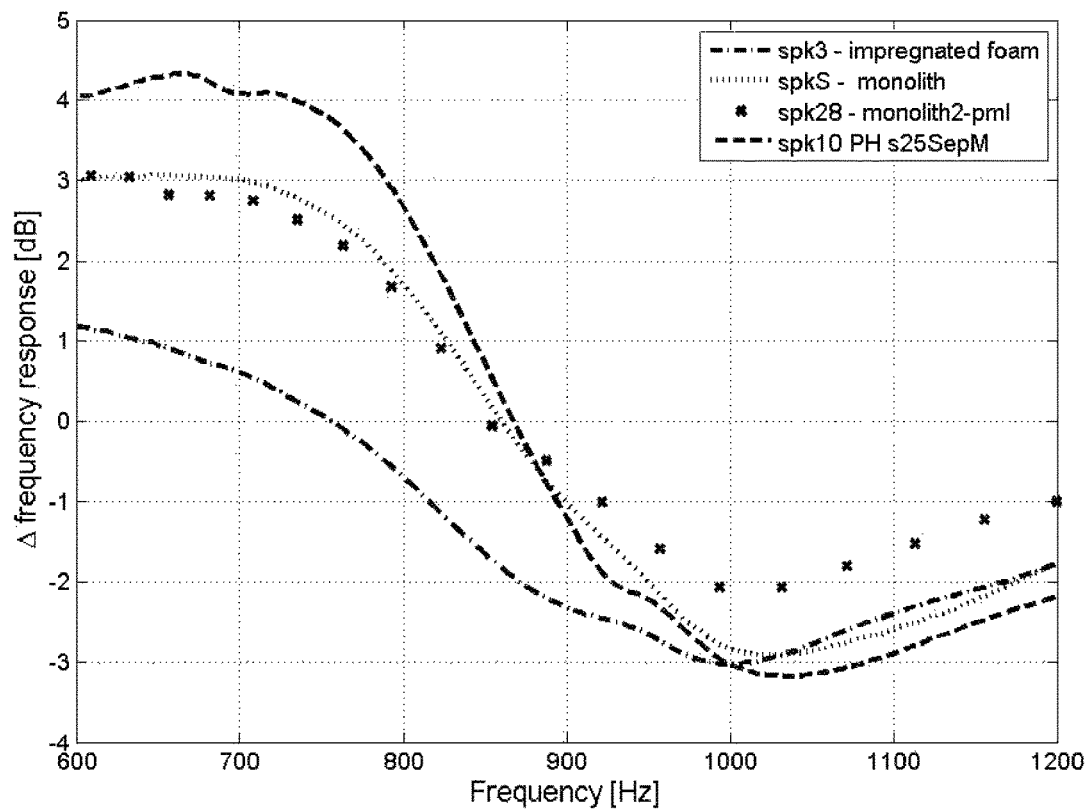
FIG. 16 illustrates differential frequency response for monolithic-like adsorbent elements of the present invention in a micro speaker.
Figure 17:
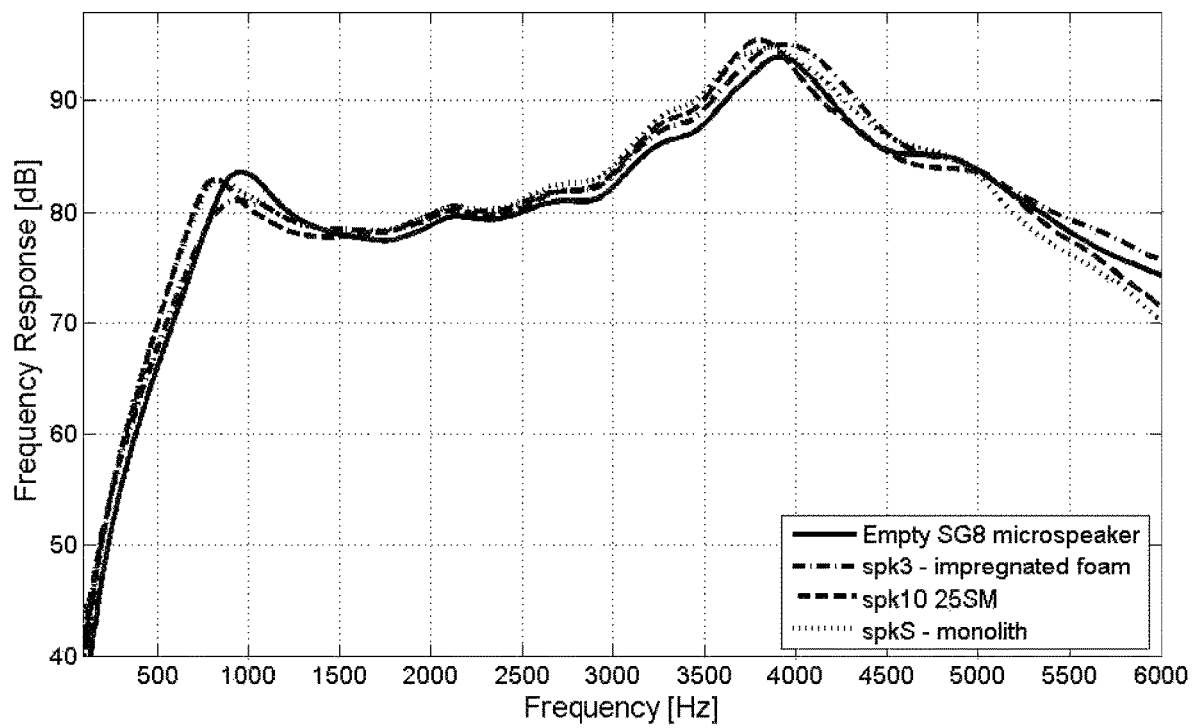
FIG. 17 illustrates frequency response for monolithic-like adsorbent elements of the present invention in a micro speaker.

It has been found that reducing the grain size of the adsorbent materials has a significant effect on their performance within the target range. In particular, loose particulate MOP materials which show poor performance are transformed into lead candidates by using MOP material which passes through a 1/12 mm to 1/10 mm mesh, a comparison between using graded and ungraded material is shown in FIGS. 12 and 13. Sample "MOPs sifted" as shown, is a particulate p-DCX material which has been sifted to remove material which has a particle size larger than 1/12 mm to 1/10 mm. Improvements in frequency response of about around 3-5 dB were recorded in the 400-700 Hz frequency range in 1 cm deep loudspeaker cavities with 75% material fill. The use of such graded "MOPs sifted" material when making the adsorbent elements with a monolith-like structure according to the present invention, provides similarly improved results.

The following presents results obtained for micro speakers partially filled with:

MOP material impregnated within a polymer matrix of polyHIPE,
impregnated foam (sold under the trade name Basotect G+, by BASF GmbH),
monolith of PDCX created by hypercrosslinging the polyHIPE itself and
monolith formed by binding PDCX powder with a latex binder material, and compared an empty micro speaker as a control.

Table 2 below presents filling characteristics and main measured obtained parameters for all of the micro speakers tested.

FIGS. 14 to 17 display impedance shifting (resonant frequency) of the enhanced micro speakers and the differential frequency response for each case.

While speaker 13 and speaker 1 present results that are inconsistent and so have been discarded as faulty prototypes.

Complete Improved Micro Speaker List

TABLE 2

Complete list of filling characteristics for micro speakers

| Speaker Name | Trace notation used in FIGS. 14-17 | Type of (partial, 85-90%) filling | $f_0$ [Hz] | Mean ΔfR [dB] 100 Hz < f < 900 Hz |
|---|---|---|---|---|
| Empty micro speaker | ━━━ | Empty closed speaker | 897.6 ≈ $V_0$ | — |
| spk3A | Not shown | MOP-polyHIPE, sample S03OCtD (3OD). | 890.9 ≈ 1.01 $V_0$ | 1.7803 |

TABLE 2-continued

Complete list of filling characteristics for micro speakers

| Speaker Name | Trace notation used in FIGS. 14-17 | Type of (partial, 85-90%) filling | $f_0$ [Hz] | Mean $\Delta fR$ [dB] 100 Hz < f < 900 Hz |
|---|---|---|---|---|
| Spk3 | — · — · — | MOP-impregnated in Basotect G+ foam | 848.31 ≈ 1.13 $V_0$ | 2.255 |
| spk6 | Not shown | MOP-polyHIPE, sample S03OCtD (3OD). | 639.5 ≈ 1.40 $V_0$ | 1.8582 |
| spk10 | — — — — | MOP-polyHIPE, sample S25SepM (25SM). | 780.9 ≈ 1.15 $V_0$ | 2.9698 |
| spk13 | Not shown | MOP-polyHIPE, sample S25SepM (25SM). | 874.3 ≈ 1.03 $V_0$ | 2.8805 |
| spk1 | Not shown | MOP-polyHIPE, sample S21SepH (21SH). | 842.0 ≈ 1.07 $V_0$ | 4.4765 |
| spk14 | Not shown | MOP-polyHIPE, sample S25SepM (21SH). | 807.8 ≈ 1.11 $V_0$ | 1.7498 |
| Spk18 | Not shown | MOP-polyHIPE, sample S25OctD (25OD). | 817.0 ≈ 1.10 $V_0$ | 1.6600 |
| SpkS | ············ | Hyper crosslinked polyhipe, MOP block, unsifted | 777.92 ≈ 1.34 $V_0$ | 3.039 |
| Spk28 | o o o o | MOP monolith, bound with latex binder | 820.83 ≈ 1.21 $V_0$ | 2.382 |

The procedure for filling the micro speakers involved un-gluing the junctions of the speakers with heat and a scalpel. Once the device was open and divided into two parts, the material filling was introduced.

General Method:

An oil soluble surfactant, a photo-initiator, a thermal initiator and optionally a reducing agent and/or catalyst for the thermal initiator are dissolved into the monomer of liquid PolyHIPE. This is then mixed constantly while adding water to get a white viscous high internal phase emulsion (HIPE). The reducing agent and/or catalyst helps break down the thermal initiator crosslinking the monomer units together. After partially crosslinking, the MOP powder is added to this emulsion. The emulsion is then injected into moulds and then irradiated with UV light to fully crosslink the polymer. The sample is freeze dried to remove the water and to maintain the highly porous structure. Finally, the MOP impregnated PolyHIPE samples (in the form of a self-supporting monolith-like element with a porous reticulated structure) are placed into the speaker cavity and the two plastic enclosure pieces are sealed together around the sample using glue to create an air-tight seal.

Metal-organic frameworks are hybrids that take advantage of properties of both organic and inorganic porous materials—forming stable, ordered and high surface areas structures.

MOFs are known as porous coordination networks, porous coordination polymers (PCPs) etc.

Certain Metal Organic Framework materials possess one or more of the following characteristics:

1. multifunctional hybrid (inorganic-organic) materials
2. formed of metal ions (nodes or joint) to which organic ligands (linker or strut) attach and extend to other ligand molecules—components provide endless possibilities
3. 3D crystalline structure (although can also be 1D or 2D)
4. Have an "indefinite" extent Nanoporous—have large pore sizes and ultrahigh porosity (up to 90% free volume)

6. Extremely large internal surface area typically >>1,000 m2/g (extending beyond 6,000 m2/g)
7. Selectively uptake small molecules
8. Can have optical or magnetic responses to the inclusion of guests
9. Synthesis from molecular building blocks holds the potential to tailor the properties of the resulting MOF
10. Behave akin to molecular sponges
11. Functionalist ion of the organic unit can provide predictably functionalised pores Typically MOFs are synthesised by combining organic ligands and metal salts in solvothermal reactions at relatively low temperatures (below 300 degrees Celsius).

Characteristics/structure of the resulting MOF is influenced by:

1. Characteristics of the ligand (bond angles, ligand length, bulkiness chirality etc.)
2. Metal ion used: tendency to adopt certain geometries Reactants mixed in high boiling polar solvents e.g. water, dialkyl formamides, dimethyl sulfoxide or acetonitrile or the like.

Concentrations of both metal salt and organic ligand which can be varied across a large range, extent of solubility of reactants, pH of the solution.

There are also several other methods for treatment e.g. electrochemical, microwave irradiation et al.

Secondary building units (SBUs) dictate the final topology of the framework. Organic linkers seldom change structure during assembly. The SBUs are often metal cluster based and result from the initial bonding between the metal ions and bridging ligands. Can form several shapes e.g. trigonal planar, square planar tetrahedral. Shape of SBU depends on structure of ligand, type of metal, ratio of metal to ligand, solvent, and source of anions to balance metal ion charge.

Pores are the void spaces formed within MOFs upon the removal of guest molecules.

In general, large pores are advantageous for conducting host-guest chemistry such as catalysis therefore mesoporous (openings between 20 and 500 Å) or macroporous (greater than 500 Å) materials are attractive.

Microporous (less than 20 Å) materials have smaller pores which result in strong interactions between gas molecules and the pore walls making them good for gas storage or gas separation applications.

Measurements of openings is performed from atom to atom while subtracting the van der Waals radii to give the space available for access by guest molecules.

Pores are usually occupied by solvent molecules that must be removed for most applications. Structural collapse can occur, the larger the pore the more likely this is. Permanent porosity results when framework remains intact.

Frameworks can interpenetrate one another to maximize packing efficiency.

MOFs may participate in post-synthetic modification (PSM) where further chemical reactions can be used to decorate the frameworks. This may be applied to modify the surface property and pore geometry.

A range of MOF and amorphous microporous organic polymer (MOP) materials can be utilised to provide an active region according to certain embodiments of the present invention. They can achieve performance benefits of traditional loudspeaker-enhancing materials, but in a cost-effective, highly stable and hydrophobic form by virtue of the polymer matrix they may be impregnated within.

In the case of MOP materials, the microporous impregnate material itself is highly hydrophobic which has benefits.

The MOP materials can be synthesized from component parts with innate hydrophobicity, resulting in a high degree of natural hydrophobicity if the resultant material. The material is preferably presented to the sound field in an uncompacted and binderless self-supporting monolith.

This can be achieved in at least two different ways;

Firstly, the self-supporting monolith, as described above, can be held close to the loudspeaker element within the housing.

In a second way the speaker cabinet housing itself can by created using a porous open-pored foam with impregnated MOP material produced by polymerising a mixture of the MOP material and an emulsion known as a High Internal Phase Emulsion (HIPE), this emulsion consists of a water droplets suspended within a polymerisable monomer. The MOP material is dispersed amongst the emulsion. Upon polymerisation the MOP is trapped in the polymer, and the water droplets are removed to leave behind a porous interconnected foam known as a polymerised HIPE (or PolyHIPE for short) impregnated with MOP material.

The emulsion comprises a hydrophobic monomer(s), surfactant and water. Other monomers can be used and this is not limited to just water, as long as the two phases which are to be used are immiscible to each other. Upon mixing the water forms droplets that are suspended in the monomer, the water droplets remain separated from each other in the emulsion. Upon polymerisation the monomer is crosslinked around these water droplets, therefore preserving the shape of the emulsion. The PolyHIPE is therefore a close replica of the initial emulsion structure.

The porosity and interconnectivity of the PolyHIPE can be controlled by altering the ratio of the water volume relative to the monomer in the initial emulsion. When the ratio of the water phase to the monomer phase exceeds 75% (7.5 ml water to 2.5 ml monomer) then the emulsion can be referred to as a high internal phase emulsion (HIPE). Increasing the amount of water past this percentage increases the amount of interconnectivity in the PolyHIPE. This is because the finite amount of monomer is constantly being stretched over an ever-increasing surface area of water droplets, therefore the thickness of the monomer surrounding the water droplets will get thinner as the water volume ratio increases. This combined with the tighter packing arrangement of the water droplets, which forces the water droplets to be pressed closer against each other, further creates a thin film of monomer and surfactant at that boundary between two adjacent droplets. During polymerisation the liquid monomer contracts as it is crosslinked into a polymer. During this contraction the thin monomer film in between adjacent water droplets is pulled apart creating connecting windows between two adjacent water droplets. A lower ratio of water to the monomer can be used, however the resulting polymer produced will not have the same amount of porosity, and the interconnectivity between the pores will be limited if any at all, this is because the monomer film surrounding the few water droplets will be very thick and will be more resistant to the effects of monomer to polymer contraction that creates the interconnectivity.

The mixing conditions used to create the initial emulsion also affect the final structure of the PolyHIPE. Increased mixing breaks up the water droplets into smaller ones which results in smaller pores in the PolyHIPE. Slower mixing means that the water droplets are not broken up as much, so larger pores are produced.

The hydrophobic monomer can comprise of a blend of different monomers. Aptly at least one of the monomer has at least 3 arms that can be crosslinked together. The monomers can be acrylates or they can be methacrylates as long as they can be polymerised together into a polymer. The mechanical properties of the resulting polyHIPE can be controlled by choosing what monomers to use, using a blend between an elastic and rigid monomer can produce a polyHIPE with mechanical properties between the two extremes of using just one of the monomers on its own. The bulk mechanical properties of the polyHIPE can also be altered by adjusting the amount of interconnectivity and porosity, which is determined by the amount of water and surfactant used in the initial emulsion.

The monomers can be polymerised into a solid by either exposing it to Ultraviolet Light (UV) or thermally by heating the emulsion. The only difference between the two methods is the initiator used. When a light sensitive photo-initiator is used, this breaks down when it absorbs UV light producing free radicals which initiate the polymerisation reaction. When a thermal initiator is used, this breaks down upon absorption of heat, to produce free radicals which initiate the polymerisation reaction. To help quickly set the PolyHIPE a possible option is that a redox reaction can also be used. With this the thermal initiator Benzoyl peroxide (Luperox® A75, Benzoyl peroxide) is reduced using the reducing agent 4,N,N-Trimethylaniline to initiate the crosslinking reaction. This process does not require the long amount of time or heat to crosslink the polymer as the thermal initiator would require when used on its own. Either the thermal or the photo-initiator can be soluble in the monomer phase or the water phase. Aptly in the monomer phase. The combination of both thermal and UV initiators can be used, where the monomer is partially crosslinked using the thermal initiator, and then fully polymerised by post exposing to UV light.

The addition of a surfactant can be used to stabilise the emulsion. The surfactant sits at the interface between the water and the oil phase reducing the surface tension that exists between the two phases. The surfactant does this by having a hydrophobic and a hydrophilic end, this causes it to orient itself at the interface between the two phases, as it is partially soluble in each. The phase where the surfactant is preferably soluble will be the continuous phase of the emulsion. Therefore, the surfactant used for the monomer in water emulsion will have a hydro lipophilic balance (HLB) number between 1 and 6. The surfactant used in this case has a HLB number of 5.6, and is the Hypermer-B246 from Croda.

The surfactant amount dissolved into the monomer phase is between 3% and 20% to create an interconnected polyHIPE upon polymerisation. It is of course possible to use lower than 3% but interconnectivity reduces, and above 20% one starts to lose the mechanical properties of the polyHIPE.

The pores of the material are kept clear by preferably saturating the material with water and methanol (50-50 by weight) before adding it to the emulsion prior to polymerising. The MOP material is hydrophobic and therefore requires methanol to disperse it into the water.

The polyHIPE framework is innately hydrophobic, giving further protection against moisture ingress into the MOP material. Further, its mechanical properties can be tuned to give the rigidity needed for it to act as all or part of the cabinet enclosure itself. This creates an opportunity to fully occupy the packaging volume available to the micro speaker component with microporous acoustic material that is actively contributing to acoustic behaviour, rather than just fill a shallow back-volume cavity within the component with adsorbent material.

In an embodiment of the present invention, it is possible to do both at once; —that is, fill a cavity defined by a housing manufactured from the MOP impregnated PolyHIPE structure itself with a supplementary adsorbent material. Such a supplementary adsorbent material may comprise MOF and/or MOP material, either entrained, embedded or suspended within a felt, or encapsulated behind a very thin poro-elastic membrane. Alternatively, the cavity within the housing manufactured from the MOP impregnated PolyHIPE may be filled with a supplementary adsorbent material comprising a monolithic element of MOF and/or MOP material. As another alternative, the cavity within the housing manufactured from the MOF and/or MOP impregnated PolyHIPE may be filled with a supplementary adsorbent material comprising PolyHIPE with MOP material. Alternatively, the housing may be manufactured from a plastic material or the like.

According to an alternative embodiment of the present invention there is a further method involving binding the MOP material into a monolith and impregnating this material into a PolyHIPE.

The speaker cabinet housing or effective volume-enhancing material itself can by created using an open-pored foam-like structure, produced by using a polymer binder (latex, PVA, etc). Upon polymerisation the MOF and/or MOP material is trapped in the polymer, and the water droplets removed to leave behind a monolithic porous interconnected foam.

The pores of the MOF and/or MOP material are kept clear of the binder by pre-saturation with methanol (10% by weight) before adding to the emulsion. This also helps the material to overcome its natural hydrophobicity and allows it to disperse more freely into the emulsion.

Latex binder dissolved in water (4.6% by weight concentration) is added to this methanol-saturated paste until the MOP concentration in the emulsion reaches around 6.6% by weight. The methanol is then evaporated from the solution by heating it to 70° C. for 20 minutes. The remaining mixture is cured by heating to 160° C. for at least 30 minutes, depending on the dimensions of the part.

This method helps fix the MOP powder into a miniature 'monolith' for use inside a micro speaker.

According to an alternative embodiment of the present invention there is a further method involving directly synthesising the MOP material into a monolithic element. For example, anhydrous dichloroethane (DCE) (7.5 mL) may be added dropwise into a mixture of monomers (e.g. 5.0 g of DCX) and FeCl3 (4.628 g) in a test tube. The resultant heterogeneous mixture may then be consolidated by centrifugation (4000 rpm, 10 min), followed by heating (18 h, 80° C.) under a slow flow of dry nitrogen. The resulting monolith can be removed from the test tube and exhaustively extracted with refluxing methanol in a Soxhlet apparatus (typically 2-3 days). The monolith may then be dried in a vacuum oven at 60° C.

According to an alternative embodiment of the present invention a high-density polymer is applied wet, either through spraying or dipping. This helps provide a high-density polymer shell between 0.1 mm and 1 mm thick. Various techniques can be used. For example painting Hammerite onto the PolyHIPE monolith.

A second alternative method is to cast or bind the polyHIPE bound MOF/MOP material into a shallow cavity of a (optionally thermoformable) high-performance acoustic membrane material such as Tecsound (http://www.custom-audiodesigns.co.uk/tecsound-acoustic-membrane.htm) or a viscoelastic damping polymer such as that found in Dedpan (http://www.wsbl.co.uk/dedpan-ds20-cl-series/).

This helps provide a composite structure, with the microporous monolith bonded to the high-tensile, high density surface material. The mechanically stiff monolith will act to damp vibration in the shell by virtue of being bonded to it. This enables a thinner "wall" to be used, and so maximises an amount of microporous volume-enhancing material that can be deployed. This can be helpful in such space-critical applications such as a mobile phone interior.

The monolith and bound forms of the material should not need the porous membrane to protect them-they are hydrophobic and robust and should not suffer granular shake-off or breakdown.

The solid black line (A) represents the acoustic frequency response of an empty micro speaker, with no filling material.

The fine dotted line (D) shows the performance of the micro speaker with side chambers occupied by the same volume of MOP-impregnated PolyHIPE material, which averages out at a 2.97 dB benefit below 900 Hz, The benefit of this material is mostly seen in the 600-900 Hz range, and causes the least damping of all of the material configurations.

This range of outcomes represents an opportunity to tune the beneficial response according to the desire of the customer.

Throughout the description and claims of this specification, the words "comprise" and "contain" and variations of them mean "including but not limited to" and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of the features and/or steps are mutually exclusive. The invention is not restricted to any details of any foregoing embodiments. The invention extends to any novel one, or novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. Apparatus for providing and/or receiving audible sound, comprising:
    a housing that provides at least one cavity region;
    a vibratable element in or proximate to the at least one cavity region; and
    an active region comprising an adsorbent element in the form of a self-supporting monolith-like element with a porous reticulated structure
    wherein the adsorbent element is confined from movement within the active region, wherein the adsorbent element comprises an adsorbent material comprising a microporous organic polymer (MOP) material.

2. The apparatus as claimed in claim 1 wherein the microporous organic polymer (MOP) material is an amorphous microporous organic polymer.

3. The apparatus as claimed in claim 2 wherein the microporous organic polymer (MOP) material is poly-dichloroxylene (P-DCX).

4. The apparatus according to claim 1 wherein the adsorbent element further comprises a binder.

5. The apparatus according to claim 4 wherein the binder comprises one or more materials selected from polymers and/or pre-polymers for the preparation of thermoplastic-type and/or thermosetting-type materials and/or latex-type materials.

6. The apparatus according to claim 1 wherein the adsorbent element further comprises a foam material.

7. The apparatus according to claim 6 wherein the foam material comprises a polymerised High Internal Phase Emulsion foam material.

8. The apparatus according to claim 1 wherein the adsorbent element comprises the microporous organic polymer (MOP) material formed by a process comprising a high internal phase emulsion polymerisation.

9. The apparatus according to claim 1 wherein the adsorbent element comprises the microporous organic polymer (MOP) material with a polymerised High Internal Phase Emulsion structure.

10. The apparatus according to claim 1 wherein the adsorbent element comprises pores of mixed porosity or wherein the adsorbent element comprises pores in the region of 1 nm to 10 nm in diameter.

11. The apparatus as claimed in claim 1 wherein the adsorbent element has a surface area of at least 500 m$^2$/g.

12. The apparatus as claimed in claim 1 wherein the adsorbent material is a material that does not have an ordered structure and optionally comprises an amorphous microstructure.

13. The apparatus as claimed in claim 1 wherein at least 80% by weight of the adsorbent material particles have a maximum diameter of 85 microns to 120 microns.

14. The apparatus according to claim 1 wherein the adsorbent material passes through a 1/10 to 1/12 mm mesh.

15. A speaker or microphone comprising the apparatus of claim 1.

16. A mobile electronic device, comprising:
    a case body; and
    at least one speaker unit or microphone unit in the case body; wherein
    each speaker unit or microphone unit comprises a housing defining at least one cavity region, a vibratable element in or proximate to the at least one cavity region and an active region that comprises an adsorbent element in the form of a self-supporting monolith-like element with a porous reticulated structure, wherein the adsorbent element is confined from movement within the active region, and wherein the adsorbent element includes an adsorbent material comprising a microporous organic polymer (MOP) material.

17. A speaker system, comprising:
    a speaker unit; and
    a cabinet forming a chamber at a back region or side region of the speaker unit largely filled with an adsorbent element in the form of a self-supporting monolith-like element with a porous reticulated structure, wherein the adsorbent element is confined from movement within the chamber, and wherein the adsorbent element includes adsorbent material which comprises microporous organic polymer (MOP) material.

18. A microphone system, comprising:
    at least one transducer element for converting sound to an electrical signal;
    optionally a preamplifier that receives an output from the at least one transducer element;
    a housing or cabinet at a back region or side region of the transducer element; and
    an active region comprising an adsorbent element in the form of a self-supporting monolith-like element with a porous reticulated structure, wherein the adsorbent element is confined from movement within the active region, and wherein the adsorbent element comprises an adsorbent material comprising a microporous organic polymer (MOP) material.

19. A mobile electronic device comprising the microphone system according to claim 18.

20. The mobile electronic device as claimed in claim 19 wherein the mobile electronic device is a mobile phone or hearing aid.

* * * * *